United States Patent
Han

(10) Patent No.: US 9,564,189 B2
(45) Date of Patent: Feb. 7, 2017

(54) MEMORY SYSTEM INCLUDING SEMICONDUCTOR MEMORY DEVICE AND PROGRAM METHOD THEREOF

(71) Applicant: SK hynix Inc., Gyeonggi-do (KR)

(72) Inventor: Ju Hyeon Han, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/066,559

(22) Filed: Mar. 10, 2016

(65) Prior Publication Data

US 2016/0329084 A1  Nov. 10, 2016

(30) Foreign Application Priority Data

May 6, 2015 (KR) .................. 10-2015-0063228

(51) Int. Cl.
  *G11C 7/00* (2006.01)
  *G11C 7/20* (2006.01)
  *G11C 16/34* (2006.01)
  *G11C 11/56* (2006.01)

(52) U.S. Cl.
  CPC .............. *G11C 7/20* (2013.01); *G11C 11/5621* (2013.01); *G11C 11/5628* (2013.01); *G11C 16/3468* (2013.01); *G11C 16/3481* (2013.01); *G11C 16/3486* (2013.01); *G11C 2211/5621* (2013.01); *G11C 2211/5624* (2013.01); *G11C 2216/14* (2013.01)

(58) Field of Classification Search
  CPC .............. G11C 11/5621; G11C 22/5628; G11C 16/3468; G11C 16/3481; G11C 16/3486; G11C 2211/5621; G11C 2211/5622; G11C 2211/5624; G11C 2211/14
  USPC .... 365/218, 185.12, 185.03, 185.11, 185.09, 365/185.22, 185.25, 185.29
  See application file for complete search history.

(56) References Cited

U.S. PATENT DOCUMENTS

| 5,712,815 | A | * | 1/1998 | Bill ..................... G11C 11/5621 |
| | | | | 365/185.03 |
| 8,073,994 | B2 | * | 12/2011 | Roberts ................. G06F 13/385 |
| | | | | 709/212 |
| 8,806,301 | B2 | | 8/2014 | Yu et al. |
| 9,330,768 | B2 | * | 5/2016 | An .......................... G11C 16/10 |
| 2008/0177922 | A1 | * | 7/2008 | Chow .................. G06F 11/2221 |
| | | | | 710/302 |
| 2013/0290558 | A1 | * | 10/2013 | Mapp .................... G06F 13/385 |
| | | | | 709/232 |

FOREIGN PATENT DOCUMENTS

| KR | 1020120100004 | 9/2012 |
| KR | 1020140006596 | 1/2014 |

* cited by examiner

*Primary Examiner* — Gene Auduong
(74) *Attorney, Agent, or Firm* — IP & T Group LLP

(57) ABSTRACT

A method of programming a memory system includes: reading a target page included in a selected memory block in response to a program request when at least one of the pages included in the selected memory block contains data; and performing a program for the target page when, among the data bits included in the data read from the target page, the number of data bits having a first logic value is equal to or less than a preset value.

20 Claims, 11 Drawing Sheets

| | | |
|---|---|---|
| BLK1 | PG1 | LA1 |
| | PG2 | LA2 |
| | ⋮ | |
| | PGn | empty |
| BLK2 | PG1 | empty |
| | PG2 | empty |
| | ⋮ | |
| | PGn | empty |
| ⋮ | | |
| BLKz | PG1 | LAp |
| | PG2 | LAp+1 |
| | ⋮ | |
| | PGn | empty |

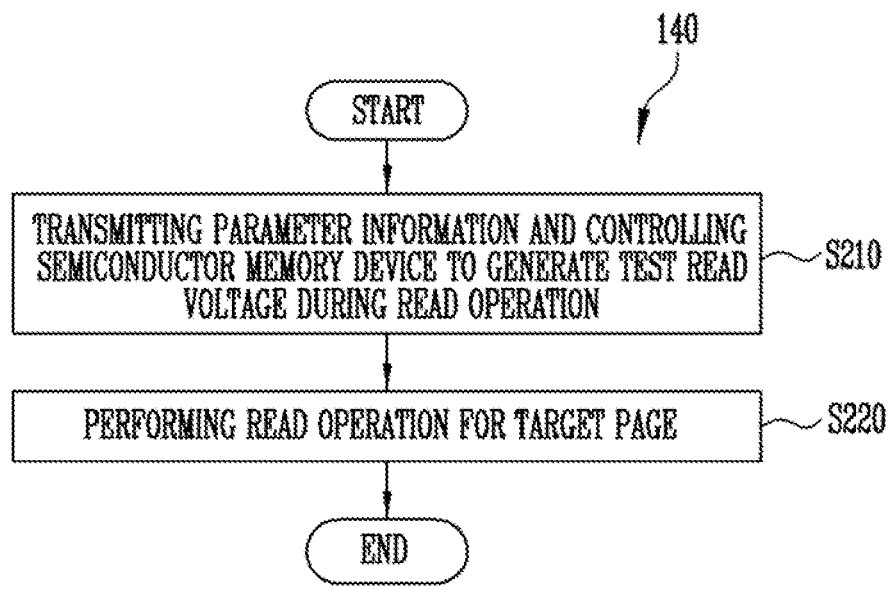

MEMORY SYSTEM INCLUDING SEMICONDUCTOR MEMORY DEVICE AND PROGRAM METHOD THEREOF

CROSS-REFERENCE TO RELATED APPLICATION

The present application claims priority to Korean patent application number 10-2015-0063228 filed on May 6, 2015, the entire disclosure of which is incorporated herein in its entirety by reference.

BACKGROUND

Field of Invention

Various embodiments of the present disclosure relate to a memory system including a semiconductor memory device and a program method thereof.

Description of Related Art

Semiconductor memory devices are memory devices implemented on a semiconductor material such as silicon (Si), germanium (Ge), gallium arsenide (GaAs), Indium phosphide (InP), or the like. Semiconductor memory devices are classified into volatile memory devices and nonvolatile memory devices.

Volatile memory devices do not retain data stored therein when power is turned off. Representative examples of volatile memory devices include static random access memory (SRAM), dynamic RAM (DRAM), synchronous DRAM (SDRAM) devices and the like. Nonvolatile memory devices maintain data stored therein even when power is turned off. Representative examples of nonvolatile memory devices include read only memory (ROM), programmable ROM (PROM), electrically programmable ROM (EPROM), electrically erasable programmable ROM (EEPROM), flash memory, phase-change random access memory (PRAM), magnetic RAM (MRAM), resistive RAM (RRAM), ferro-electric RAM (FRAM) devices, etc. Flash memory devices are widely used and are generally classified into NOR and NAND type memory devices.

SUMMARY

Various embodiments of the present disclosure are directed to a memory system including a semiconductor memory device having improved reliability and a program method thereof.

One embodiment of the present disclosure provides a method of programming a memory system including a semiconductor memory device with a plurality of memory blocks, the method including: reading a target page included in a selected memory block in response to a program request when at least one of pages included in the selected memory block contains data; and performing a program for the target page when, among data bits included in the data read from the target page, a number of data bits having a first logic value is equal to or less than a preset value.

The method may further include: performing the program on a page of a memory block other than the selected memory block when, among data bits included in the read data, the number of data bits having the first logic value is greater than the preset value.

The method may further include: performing a partial erase operation for the target page when, among data bits included in the read data, the number of data bits having the first logic value is greater than the preset value; and performing a program for the target page after the partial erase operation.

The method may further include: performing the program for the target page when the pages included in the selected memory block do not contain data.

The pages included in the selected memory block may have an erase state and a plurality of program states when storing data. The test read voltage may fall within a read margin between a voltage range of the erase state and a voltage range of a lowest program state among the plurality of program states.

The reading the target page may include: reading the target page included in the selected memory block in response to the program request using a test read voltage.

The reading the target page using the test read voltage may include: controlling the semiconductor memory device to generate the test read voltage during a read operation; and controlling the semiconductor memory device to perform the read operation for the target page.

The method may further include: receiving the program request; and defining the target page included in the selected memory block in response to the program request.

The defining the target page may include: converting a logic block address included in the program request into a physical block address corresponding to the target page with reference to mapping information between logic block addresses and physical block addresses.

Another embodiment of the present disclosure provides a memory system including: a semiconductor memory device comprising a plurality of memory blocks, each of which includes a plurality of pages; and a controller configured so that the controller reads a target page depending on whether at least one of pages of a memory block including the target page contains data, wherein the controller performs a program for the target page when, among data bits included in the data read from the target page, a number of data bits having a first logic value is equal to or less than a preset value.

A further embodiment of the present disclosure provides a memory system including: a semiconductor memory device comprising a plurality of memory blocks, each of which includes a plurality of pages; and a controller configured so that the controller reads a target page depending on whether, among pages of a first memory block including the target page, a number of pages that contain data is a predetermined number or more, wherein the controller performs a program for the target page when, among data bits included in the data read from the target page, a number of data bits having a first logic value is equal to or less than a preset value.

In accordance with an embodiment of the present disclosure, a memory system having enhanced reliability and a program method thereof can be provided.

BRIEF DESCRIPTION OF THE DRAWINGS

In the figures, dimensions may be exaggerated for clarity of illustration. Also, it will be understood that when an element is referred to as being "between" two elements, it can be the only element between the two elements, or one or more intervening elements may also be present. Like reference numerals refer to like elements throughout.

FIG. 7 is a flowchart illustrating a read operation for a target page, according to an embodiment of the present disclosure;

FIG. 8 is a diagram illustrating open block information, according to an embodiment of the present disclosure;

DETAILED DESCRIPTION

Hereinafter, exemplary embodiments of the present disclosure will be described in detail with reference to the attached drawings. In the following description, only parts required for understanding of operations in accordance with the present disclosure will be described, and explanations of the other parts will be omitted so as not to make the present disclosure unclear. Accordingly, the present disclosure is not limited to the following embodiments, but may be embodied in many other embodiments and variations thereof. Rather, the described embodiments are provided so that the present disclosure will be thorough and complete, and will fully convey the invention to those skilled in the art to which this invention pertains.

It will be understood that when an element is referred to as being "coupled" or "connected" to another element, it can be directly coupled or connected to the other element, or intervening elements may be present therebetween. Furthermore, the terms "comprising" or "including" as used herein are inclusive, open-ended terms and do not exclude additional, unrecited elements or method steps.

Figure 1:
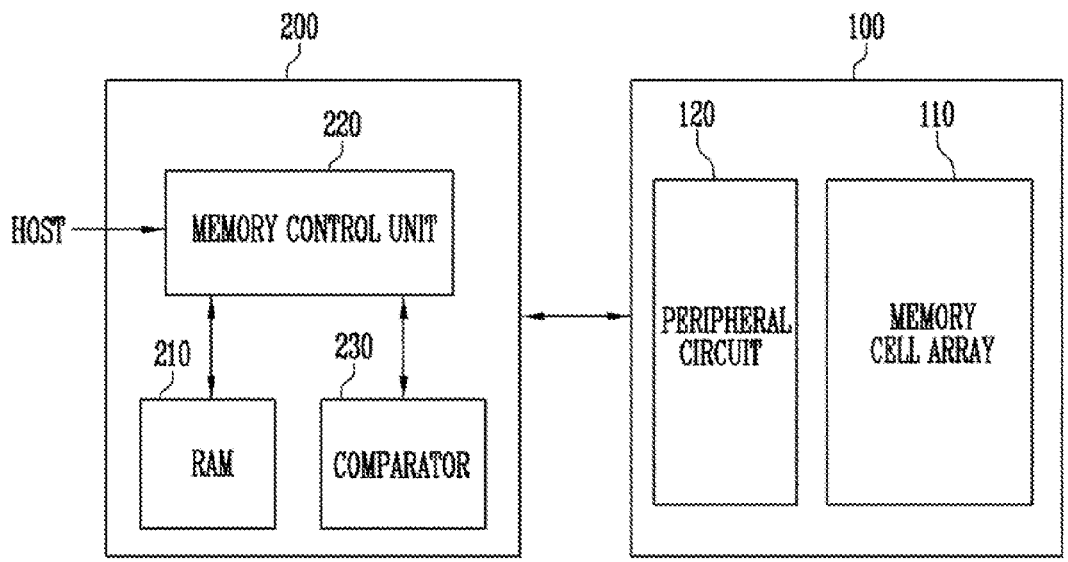
FIG. 1 is a block diagram illustrating a memory system including a semiconductor memory device, according to an embodiment of the present disclosure.

FIG. 1 is a block diagram illustrating a memory system 50 comprising a semiconductor memory device 100, according to an embodiment of the present disclosure.

The memory system 50 may further include a controller 200 for controlling the operation of the semiconductor memory device 100.

The semiconductor memory device 100 may operate under the control of the controller 200. The semiconductor memory device 100 may include a memory cell array 110 and a peripheral circuit 120 for driving the memory cell array 110. The memory cell array 110 may include a plurality of nonvolatile memory cells. The nonvolatile memory cells may be arranged in memory regions such as blocks. Each memory region may be arranged in sub-regions, for example a memory block may be arranged in a plurality of pages each page comprising a plurality of memory cells.

The peripheral circuit 120 may operate under the control of the controller 200. The peripheral circuit 120 may program data into the memory cell array 110 under the control of the controller 200. The peripheral circuit 120 may read data from the memory cell array 110 under the control of the controller 200 and output the read data to the controller 200. The peripheral circuit 120 may also erase data from the memory cell array 110 under the control of the controller 200.

For example, during a program operation, the peripheral circuit 120 may receive a program command, a physical block address, and data to be programmed from the controller 200. One memory block and one page included in the memory block may be selected by the physical block address. The peripheral circuit 120 may program the data to be programmed into the selected page.

During a read operation, the peripheral circuit 120 may receive a read command and a physical block address from the controller 200. One memory block and one page included in the memory block may be selected by the physical block address. The peripheral circuit 120 may read the selected page and output the read data to the controller 200.

During an erase operation, the peripheral circuit 120 may receive an erase command and a physical block address from the controller 200. One memory block, or at least one page included in one memory block, may be selected by the physical block address. The peripheral circuit 120 may erase the data stored in a selected region.

In an embodiment, the semiconductor memory device 100 may be a flash memory device.

The controller 200 may control the overall operation of the semiconductor memory device 100. For example, the controller 200 may be configured to access the semiconductor memory device 100 in response to a request from a host.

The controller 200 may include a random access memory (RAM) 210, a memory control unit 220, and a comparator 230.

The RAM 210 may operate under the control of the memory control unit 220. For example, the memory control unit 220 may be configured to perform one or more control operations such as read, program, erase, and/or background operations of the semiconductor memory device 100. The memory control unit 220 may be configured to drive firmware for controlling the semiconductor memory device 100.

When a host transmits a program request to the controller, the memory control unit 220 may identify a sub-region of the memory array such as a page corresponding to the program request (hereinafter, referred to as a target page). The memory control unit 220 may convert the logical block address included in the program request into a physical block address. In an embodiment, the physical block address may indicate a target page of the memory array.

In an embodiment, the memory control unit 220 may perform the function of a flash translation layer (FTL). The memory control unit 220 may store and manage, in the RAM 210, a map table including a relationship mapping between physical block addresses corresponding to the memory cell array 110 and logical block addresses corresponding to the physical block addresses. Hence, the memory control unit 220 may convert a logical block address included in a program request into a physical block address with reference to the map table. For example, the memory control unit 220 may map a physical block address to the logical block address included in the program request.

When a host transmits a program request, data to be programmed is received by the controller 200 from the host. The memory control unit 220 may temporarily store the data to be programmed in the RAM 210. Hence, the RAM 210 may be used as a buffer memory between the host and the semiconductor memory device 100.

According to an embodiment of the present disclosure, the memory control unit 220 may determine, before sending a program command to the semiconductor memory device 100 in response to a program request, whether or not the memory block which includes the target page is an open block, and may read the target page using a test read voltage depending on the result of the determination.

In an embodiment, an open memory block may be defined as a memory block which includes a target page, and also has at least one page capable of storing data. For example, when a memory block includes a target page and has also a page that has already been programmed, the memory block can be defined as an open block. In another embodiment, an open memory block may be defined as a memory block which includes a target page and at least a predetermined number of pages in the memory block have data stored therein.

The controller 200 may obtain data read from a target page. The comparator 230 may compare the data bits included in the data read from the target page, the number of data bits having a first logic value with a preset value. The number of data bits having the first logic value may denote the number of memory cells of the target page that have threshold voltages higher than a test read voltage. Conversely, the number of data bits having a second logic value may denote the number of memory cells of the target page having threshold voltages equal to or lower than the test read voltage.

The expression "the number of memory cells having threshold voltages higher than the test read voltage is greater than the preset value" may mean that the threshold voltages of a large number of memory cells have increased despite the fact that a program operation for the target page has not yet been performed. When a program operation for memory cells having increased threshold voltages is performed, the data stored in the corresponding memory cells may be comparatively unreliable.

According to the embodiment of the present disclosure, when, among the data bits included in the read data, the number of data bits having the first logic value is greater than the preset value, the memory control unit 220 may perform a program for a page of a memory block other than the memory block including the target page. When, among the data bits included in the read data, the number of data bits having the first logic value is equal to or less than the preset value, the memory control unit 220 may performs a program for the target page. Consequently, data to be programmed can be reliably stored in the memory cell array 100. Consequently, a memory system having enhanced reliability and a program method thereof can be provided.

Figure 2:
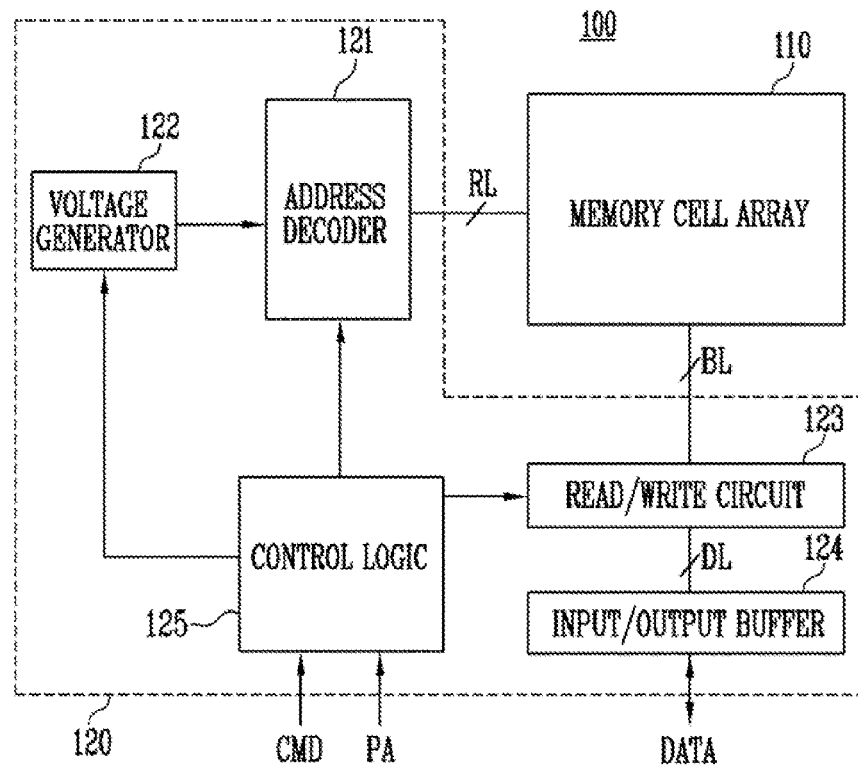
FIG. 2 is a block diagram illustrating a semiconductor memory device, according to an embodiment of the present disclosure.

Referring to FIG. 2 a semiconductor memory device according to an embodiment of the present disclosure is provided. For example, the semiconductor memory device of FIG. 2 may be the semiconductor memory device 100 of FIG. 1.

The semiconductor memory device 100 may include the memory cell array 110 and the peripheral circuit 120. The peripheral circuit 120 may include an address decoder 121, a voltage generator 122, a read and write (read/write) circuit 123, an input and output (input/output) buffer 124 and a control logic 125.

The memory cell array 110 may include a plurality of memory cells. The memory cells may be coupled to the address decoder 121 through row lines RL. The memory cells may be coupled to the read/write circuit 123 through bit lines BL.

Figure 3:
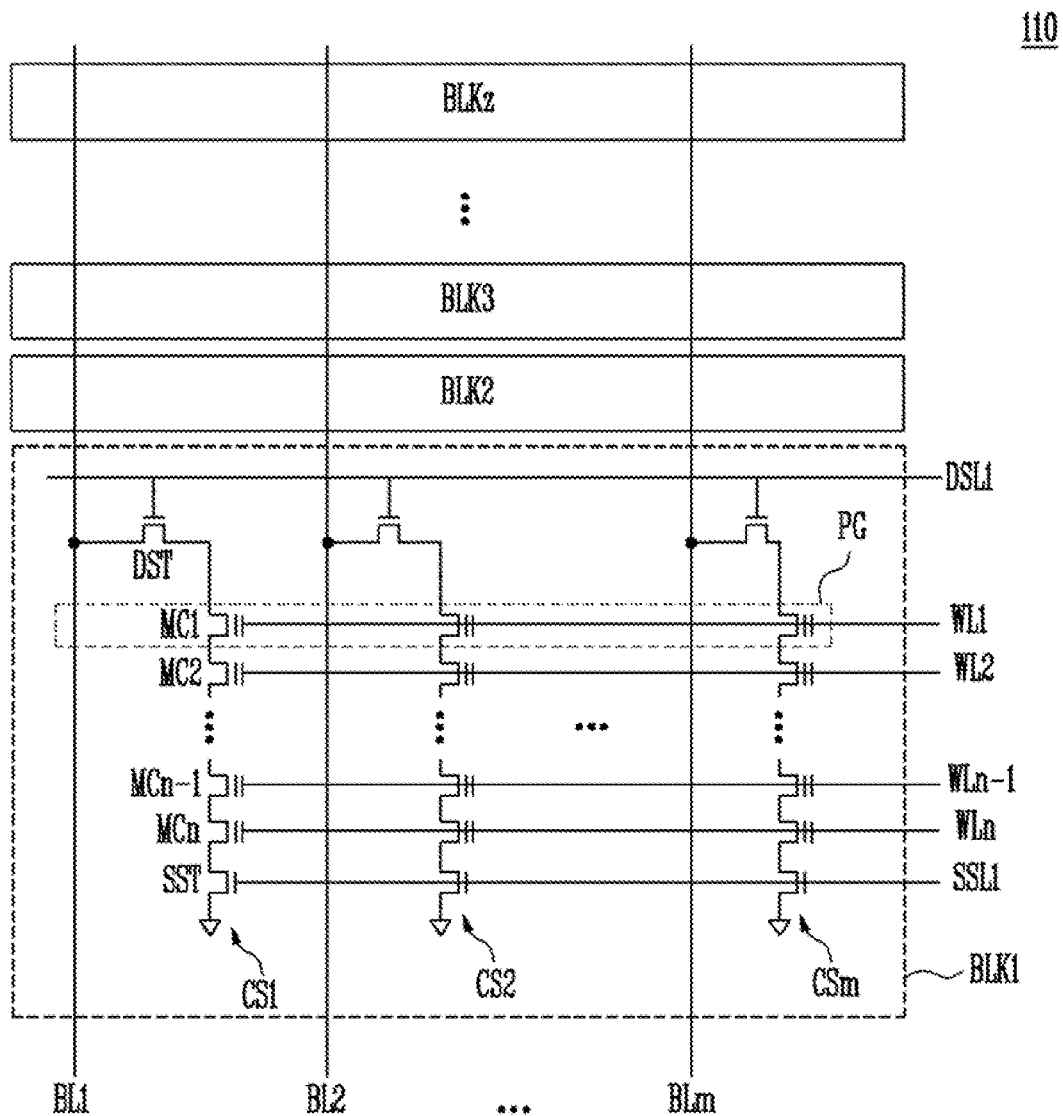
FIG. 3 is a block diagram illustrating a memory cell array, according to an embodiment of the present disclosure.

FIG. 3 is a block diagram showing a memory cell array according to an embodiment of the present disclosure. For example, the memory cell array of FIG. 3 may be the memory cell array 110 of FIG. 2.

Referring to FIG. 3, the memory cell array 110 may include first to z-th memory blocks BLK1 to BLKz. The first to z-th memory blocks BLK1 to BLKz may be coupled in common to first to m-th bit lines BL1 to BLm. The first to m-th bit lines BL1 to BLm may form the bit lines BL of FIG. 2.

In FIG. 3, for the sake of explanation, elements of only the first memory block BLK1, among the plurality of memory blocks BLK1 to BLKz, are illustrated. Illustration of elements included in the other memory blocks BLK2 to BLKz is omitted. It will be understood that each of the memory blocks BLK2 to BLKz may have the same configuration as the first memory block BLK1.

The memory block BLK1 may include a plurality of cell strings CS1 to CSm. The first to m-th cell strings CS1 to CSm may be coupled to the first to m-th bit lines BL1 to BLm, respectively.

Each of the first to m-th cell strings CS1 to CSm may include a drain select transistor DST, a plurality of memory cells MC1 to MCn coupled in series to each other, and a source select transistor SST. The drain select transistor DST may be coupled to a drain select line DSL1. The first to n-th memory cells MC1 to MCn may be coupled to first to n-th word lines WL1 to WLn, respectively. The source select transistor SST may be coupled to a source select line SSL1.

A drain side of the drain select transistor DST may be coupled to the corresponding bit line. The source side of the source select transistor SST may be coupled to a reference voltage node. In an embodiment, the source side of the source select transistor SST may be coupled to a common source line (not shown). The common source line may be controlled by the control logic 125 of FIG. 2.

In the first to m-th cell strings CS1 to CSm, memory cells coupled to each word line may form a single page PG. Therefore, each memory block BLK1 may include a plurality of pages.

The drain select line DSL1, the first to n-th word lines WL1 to WLn, and the source select line SSL1 may be included in the row lines RL of FIG. 2. The drain select line DSL1, the first to n-th word lines WL1 to WLn, and the source select line SSL1 may be controlled by the address decoder 121. The first to m-th bit lines BL1 to BLm may be controlled by the read/write circuit 123.

Referring again to FIG. 2, the peripheral circuit 120 may include the address decoder 121, the voltage generator 122, the read/write circuit 123, the input/output buffer 124 and the control logic 125.

The address decoder 121 may be coupled to the memory cell array 110 through the row lines RL. The address decoder 121 may be configured to be operated under the control of the control logic 125. The address decoder 121 may receive a physical block address PA through the control logic 125.

A program operation of the semiconductor memory device 100 may be performed in pages (refer to PG of FIG. 3). A read operation of the semiconductor memory device 100 may be performed in pages. A physical block address PA received during a program or a read operation may include a block address and a row address.

The address decoder 121 may be configured to decode a block address of a received physical block address PA. The address decoder 121 may select a corresponding memory block from the plurality of the memory blocks BLK1 to BLKz (refer to FIG. 3) in response to the decoded block address.

The address decoder 121 may be configured to decode a row address of a received physical block address PA and select a corresponding word line of a selected memory block. Thereby, one page may be selected.

During a program operation, the address decoder 121 may apply a high-level program voltage from the voltage generator 122 to the selected word line and a program pass voltage from the voltage generator 122 to unselected word lines. The program pass voltage may be lower than the program voltage. During a read operation using a test read voltage, the address decoder 121 may apply the test read voltage from the voltage generator 122 to the selected word line and a read pass voltage from the voltage generator 122 to the unselected word lines. The read pass voltage may be higher than the test read voltage.

The voltage generator 122 may operate under the control of the control logic 125. The voltage generator 122 may generate an internal power voltage using an external power voltage that is applied to the semiconductor memory device 100. For example, the voltage generator 122 may generate an internal power voltage by regulating the external power voltage. The generated internal power voltage may be applied to the address decoder 121, the read/write circuit 123, the input/output buffer 124, and the control logic 25, and may be used as the operating voltage of the semiconductor memory device 100.

The voltage generator 122 may generate a plurality of voltages using at least one of the external and the internal power voltages. In an embodiment, the voltage generator 122 may include a plurality of pumping capacitors that receive an internal power voltage and may generate a plurality of voltages by selectively activating the plurality of pumping capacitors under the control of the control logic 125. For example, during a program operation, the voltage generator 122 may generate a high-level program voltage and a program pass voltage having a level lower than that of the program voltage. In another example, during the read operation using a test read voltage, the voltage generator 122 may generate a test read voltage and a read pass voltage having a level higher than that of the read voltage. The generated voltages may be supplied to the address decoder 121.

The read/write circuit 123 may be coupled to the memory cell array 110 through the bit lines BL. The read/write circuit 123 may operate under the control of the control logic 125.

During a program operation, the read/write circuit 123 may transmit data DATA to be programmed, received through the input/output buffer 124, to the bit lines BL. The data DATA to be programmed may be stored in the selected page. During a read operation, the read/write circuit 123 may read data DATA from the selected page of the memory cell array 110 through the bit lines BL and may output the read data to the input/output buffer 124.

The input/output buffer 124 may be coupled to the read/write circuit 123 through the data lines DL. The input/output buffer 124 may operate under the control of the control logic 125. The input/output buffer 124 may communicate with the controller 200.

The control logic 125 may be configured to control the overall operation of the semiconductor memory device 100. For example, the control logic 125 may receive a command CMD and a physical block address PA from a host. During a read operation, the command CMD may be a read command. During a program operation, the command CMD may be a program command. During an erase operation, the command CMD may be an erase command. The control logic 125 may be configured to control the address decoder 121, the voltage generator 122, the read/write circuit 123, and the input/output buffer 124 in response to the received command CMD.

Parameter set-up information for changing set values of the semiconductor memory device 100 may be received as the command CMD. The parameter set-up information may include information for setting the test read voltage. When the parameter set-up information is received, the control logic 25 may control the voltage generator 122 to generate a test read voltage in accordance with the parameter set-up information during a read operation.

Figure 4:
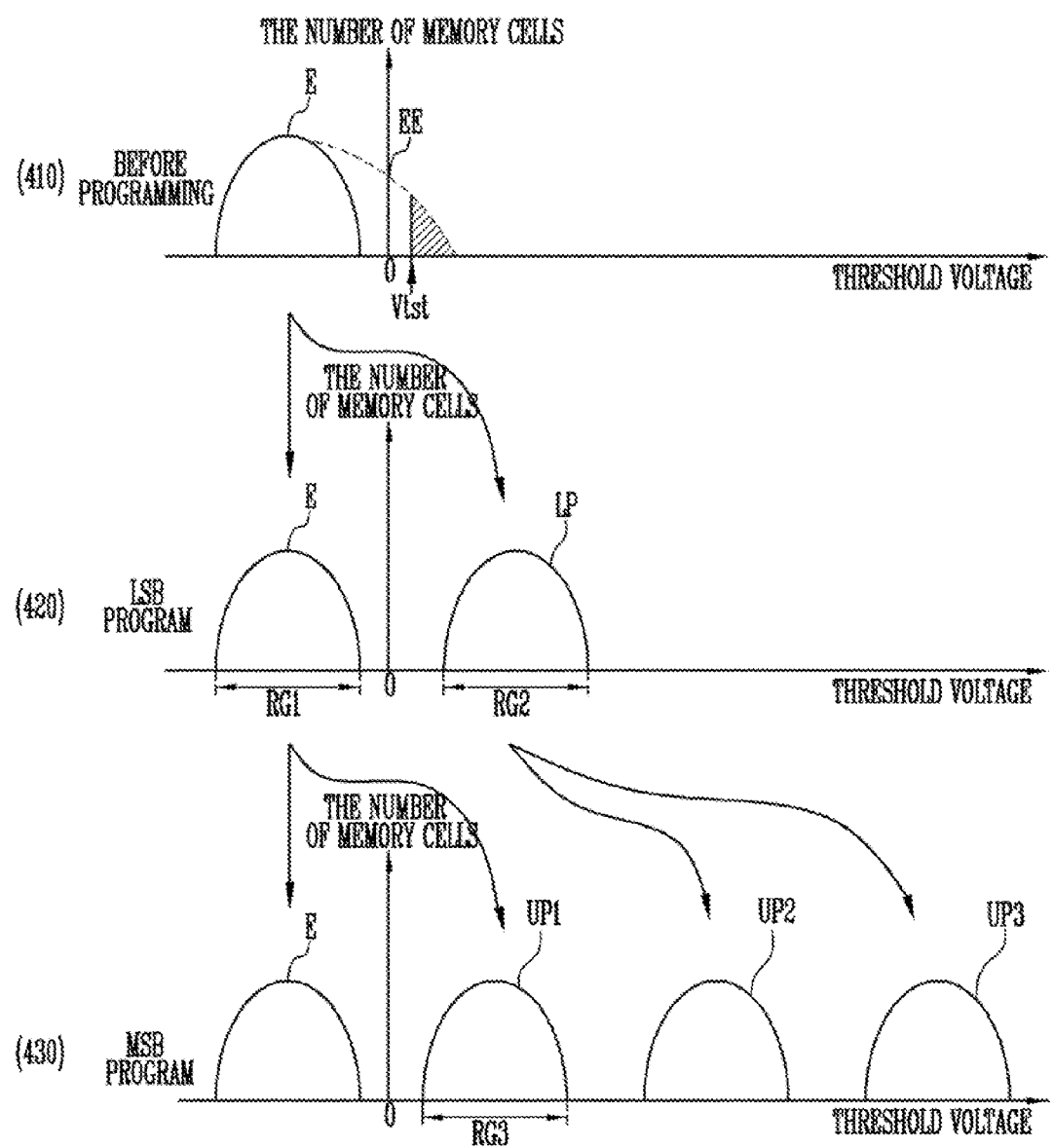
FIG. 4 is a diagram illustrating threshold voltage states of memory cells before programming, during a least significant bit programming and during a most significant bit programming, according to an embodiment of the present disclosure.

FIG. 4 is a diagram showing threshold voltage states of the memory cells before programming, during a least significant bit (LSB) programming and during a most significant bit (MSB) programming, according to an embodiment of the present disclosure. In FIG. 4, the horizontal axis represents a threshold voltage, and the vertical axis represents the number of memory cells. In the following description with reference to FIG. 4, it is assumed that each memory cell may store two bits. However, it will be understood that the scope of the present disclosure is not limited to this. For example, each memory cell may store three bits, and the memory cells may have eight threshold voltage states.

Referring to FIG. 4, before a program operation is performed, the memory cells may have an erase state E (410). For example, a voltage range corresponding to the erase state E may be lower than a ground voltage.

As the result of LSB programming, the memory cells may have two threshold voltage states E and LP (420). The memory cells may be programmed to have an erase state E or a lower program state LP. Each memory cell may store one data bit corresponding to a logic value "1" or a logic value "0".

After the LSB programming, MSB programming may be performed (430). As the result of MSB programming, the memory cells may have four threshold voltage states E, UP1, UP2, and UP3. Depending on the data to be programmed, the memory cells having the erase state E and the lower program state LP may be programmed to have the erase state E and first to third upper program states UP1 to UP3. For example, the memory cell having the erase state E may be programmed to have the erase state E or the first upper program state UP1. The memory cell having the lower program state LP may be programmed to have the second upper program state UP2 or the third upper program state UP3. The first upper program state UP1 may be the program state having the lowest voltage range among the program states UP1 to UP3 produced by the MSB program. Two data bits may be stored in each memory cell.

The threshold voltages of the memory cells having the erase state E may be increased by a variety of factors. As an example, when accessing each of the pages of the memory block (e.g., for a program operation or read operation), the threshold voltages of the memory cells having the erase state E may be undesirably increased by voltages applied to the bit lines BL1 to BLm of FIG. 3 and the word lines WL1 to WLn of FIG. 3 of the corresponding memory block. As another example, in the case where the corresponding memory cells and adjacent memory cells have the erase state E and the program states LP and UP1 to UP3, the threshold voltages of the memory cells having the erase state E may be increased by coupling to adjacent memory cells having high threshold voltages. That is, in the case where program operations for specific pages in the memory block are performed, memory cells in the pages of the same memory block that have not yet been programmed may have a transformed erase state EE. In other words, in the case where the memory block including the target page is an open block, memory cells of the target page may have the transformed erase state EE.

In the embodiment as shown in FIG. 4, it is assumed that the threshold voltages of the memory cells having the erase state E are undesirably increased, and thus the memory cells have the transformed erase state EE. Some of the memory cells having the transformed erase state EE (indicated by the hatched region in FIG. 4) may have threshold voltages higher than the test read voltage Vtst. Subsequently, when the LSB programming is performed, memory cells to be programmed to the lower program state LP may have excessively high threshold voltages. That is, the lower program state LP may have a voltage range that is wider and higher than a second voltage range RG2, and memory cells to be programmed to the erase state E may still have the transformed erase state EE. Therefore, the reliability of the data stored in the memory cells may suffer. In addition, the reliability of MSB data to be stored in the memory cells when MSB programming is performed may also be deteriorated.

In the embodiment of the present disclosure, the controller 200 of FIG. 1 may be configured to determine whether or not the memory block including the target page is an open block. Following this determination, the controller 200 may then read the target page using the test read voltage Vtst depending on the result of the determination. In an embodiment, the test read voltage Vtst may be higher than the ground voltage. In an embodiment, the test read voltage Vtst may fall within a read margin between the voltage range RG1 of the erase state E and the voltage range RG2 of the lower program state LP. In another embodiment, the test read voltage Vtst may fall within a read margin between the voltage range RG1 of the erase state E and a voltage range RG3 of the lowest program state UP1 among the upper program states UP1 to UP3.

When, among the memory cells of the target page, the number of memory cells having threshold voltages higher than the test read voltage Vtst is equal to or less than a preset value, the controller 200 may perform a program for the target page. When, among the memory cells of the target page, the number of memory cells having threshold voltages higher than the test read voltage Vtst is greater than the preset value, the controller 200 may perform a program for a page of another memory block instead of the target page. Therefore, data to be programmed can be reliably stored in the target page or in another page. Consequently, a memory system having enhanced reliability and a program method thereof can be provided.

Figure 5:
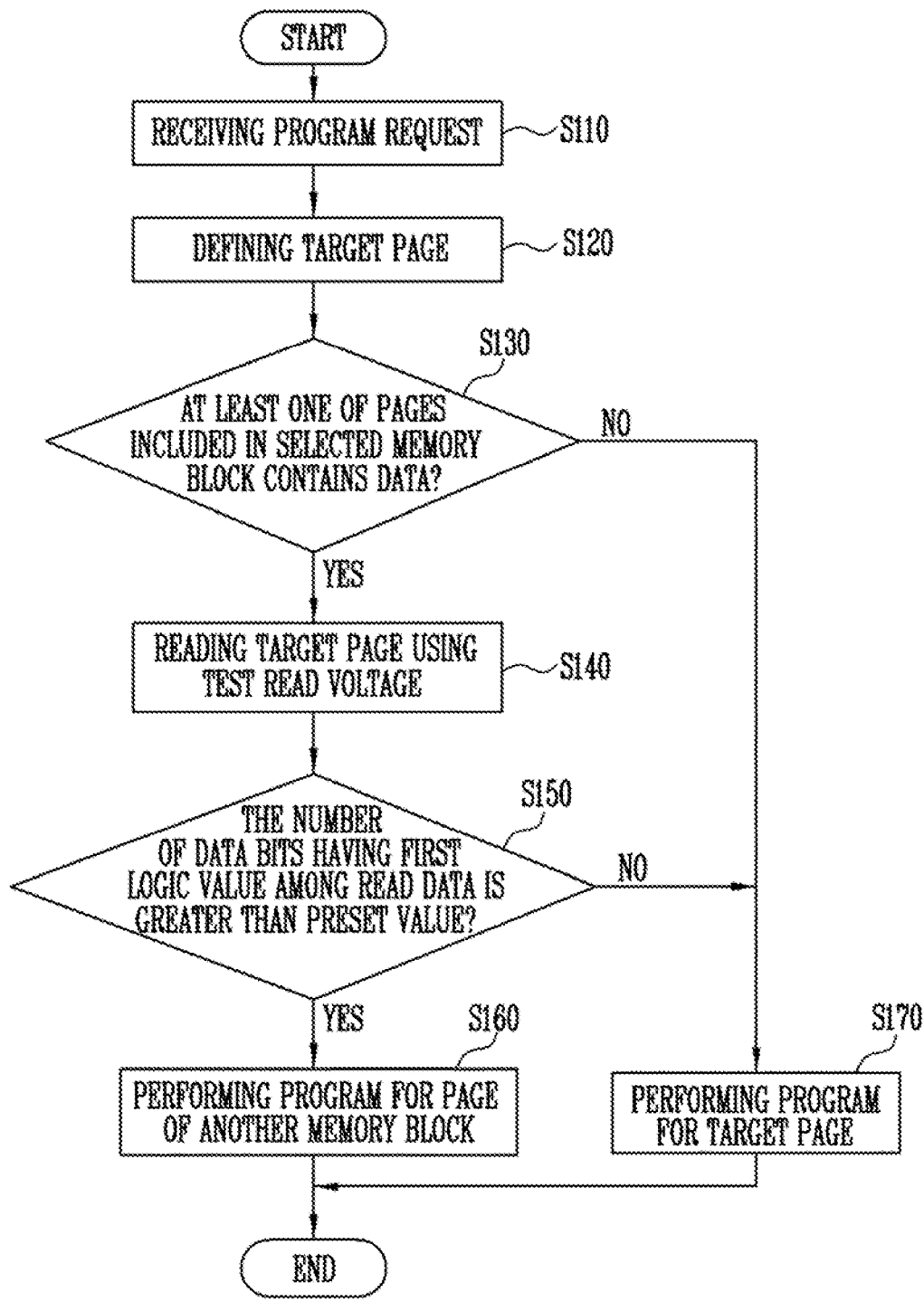
FIG. 5 is a flowchart showing a method for operating a memory system, according to an embodiment of the present disclosure.
Figure 6:
FIG. 6 is a diagram illustrating a map table, according to an embodiment of the present disclosure.

Referring to FIG. 5 a flowchart showing a method for operating a memory system is provided, according to an embodiment of the present disclosure. For example, the operation of FIG. 5 may be performed by the memory system 50 in FIG. 1. FIG. 6 illustrates a map table, according to an embodiment of the present disclosure. For example, the map table of FIG. 6 may be embodied within the RAM 210 in FIG. 1. FIG. 7 is a flowchart showing a read operation for a target page according to an embodiment of the present disclosure. For example, the operation of FIG. 7 may be an embodiment of step S140 of FIG. 5.

Referring now to FIG. 5, at step S110, a program request may be received from a host. The program request may include a logic block address.

At step S120, a target page may be selected. For example, the memory control unit 220 of FIG. 1 may convert a logical block address included in the program request into a physical block address defining a target page.

At step S130, it is determined whether data is stored in at least one of the pages included in the selected memory block. Also, it is determined whether the selected memory block is an open block. The selected memory block may be a memory block including the target page. The memory control unit 220 may access the map table of the RAM 210 for obtaining mapping information pertaining to the selected memory block, and may determine whether at least one of the pages included in the selected memory block has been already programmed.

In another embodiment, the memory control unit 220 may determine whether, among the pages of the selected memory block, data is stored in a predetermined number of pages or more. The memory control unit 220 may determine whether, among the pages of the selected memory block, a predetermined number of pages or more have been already programmed by querying the map table of the RAM 210 about mapping information pertaining to the selected memory block.

Referring to FIG. 6, the map table MPT shows logical block addresses mapped in the respective pages PG1 to PGn of the memory blocks BLK1 to BLKz. For example, first and second pages PG1 and PG2 of a first memory block BLK1 may be mapped to first and second logical block addresses LA1 and LA2, respectively. The n-th page PGn of the first memory block BLK1 may not be mapped to any logical block address indicating that the n-th page PGn of the first memory block BLK1 may not contain any data. The first memory block BLK1 may include at least one page, for example pages PG1 and PG2 that already contain data. Hence, when the n-th page PGn of the first memory block BLK1 is a target page, the first memory block BLK1 may be identified as an open block.

First to n-th pages PG1 to PGn of the second memory block BLK2 may not store any data. Hence, when any one of the pages of the second memory block BLK2 is defined as a target page, the second memory block BLK2 may not be identified as an open block. First and second pages PG1 and PG2 of the z-th memory block BLKz may be respectively mapped in p-th and (p+1)-th logical block addresses LAp and LAp+1. The n-th page PGn of the z-th memory block BLKz may not contain data. When the n-th page PGn of the z-th memory block BLKz is defined as a target page, the z-th memory block BLKz may be identified as an open block.

Referring again to FIG. 5, at step S140, the target page may be read using the test read voltage Vtst. Step S140 may be detailed as shown in FIG. 7.

Referring to FIG. 7, at step S210, as parameter information is transmitted, the semiconductor memory device 100 may be controlled so that the test read voltage Vtst may be generated during a read operation. According to the parameter information, the control logic 125 of FIG. 2 may set the voltage generator 122 of FIG. 2 to generate the test read voltage Vtst. At step S220, a read operation for the target page may be performed. The memory controller 220 may transmit a read command and a physical block address corresponding to the target page to the semiconductor memory device 100. The semiconductor memory device 100 may perform the read operation for the target page in response to the read command. The voltage generator 122 may generate the test read voltage Vtst. The generated test read voltage Vtst may be applied by the address decoder 121 of FIG. 2 to a word line coupled to the target page. The read/write circuit 123 of FIG. 2 may read data from the target page. The data read from the target page may be determined depending on whether the threshold voltages of the memory cells of the target page are higher than the test read voltage. The read data may be outputted to the controller 200. Thereby, the memory control unit 220 may obtain the data of the target page.

Referring again to FIG. 5, at step S150, it may be determined whether, among the read data, the number of data bits having the first logic value is greater than a preset value. The read data may be provided to the comparator 230 of FIG. 1. The comparator 230 may count the number of data bits having the first logic value among the read data and determine whether the count is greater than the preset value. In an embodiment, the preset value may be 1. In other words, it may be determined whether, among the memory cells of the target page, the number of memory cells having threshold voltages higher than the test read voltage is greater than 1.

When, among the read data, the number of data bits having the first logic value is greater than a preset value, step S160 then step S170 may be performed. When, among the read data, the number of data bits having the first logic value is equal to or less than the preset value, then step S170 may be performed.

At step S160, a program for a page (hereinafter, referred to as a substitution page) of a memory block other than the selected memory block may be performed. The memory control unit 220 of FIG. 1 may cancel mapping between the logic block address included in the program request and the physical block address corresponding to the target page, and may map the logical block address included in the program request to a physical block address corresponding to the substitution page. This mapping may be updated in the map table. The memory control unit 220 may provide the program command, the physical block address corresponding to the substitution page, and data to be programmed to the semiconductor memory device 100. The semiconductor memory device 100 may program the data to be programmed into the substitution page.

At step S170, programming for the target page may be performed. The memory control unit 220 may provide the program command, the physical block address corresponding to the target page, and data to be programmed to the semiconductor memory device 100. The semiconductor memory device 100 may program the data to be programmed into the target page.

FIG. 8 is a diagram showing open block information according to an embodiment of the present disclosure. For example, the open block information OBI may be stored in the RAM 210 of FIG. 1.

Referring to FIG. 8, the memory control unit 220 of FIG. 1 may store and manage the open block information OBI in the RAM 210 with reference to the map table MPT of FIG. 6 so as to improve the operation speed of the memory device. The open block information OBI may represent whether each of the first to z-th memory blocks BLK1 to BLKz is an open block. In the embodiment of FIG. 8, the second and z-th memory blocks BLK2 and BLKz may be open blocks and the first and third memory blocks BLK1 and BLK3 may not be open blocks.

In an embodiment, the open block information OBI may be managed by the controller. For example, the memory control unit 220 may search for the memory block containing the target page in the open block information OBI and determine rapidly whether the corresponding memory block is an open block. Hence, by managing the open block information OBI, step S130 of FIG. 5 may be performed rapidly.

Figure 9:
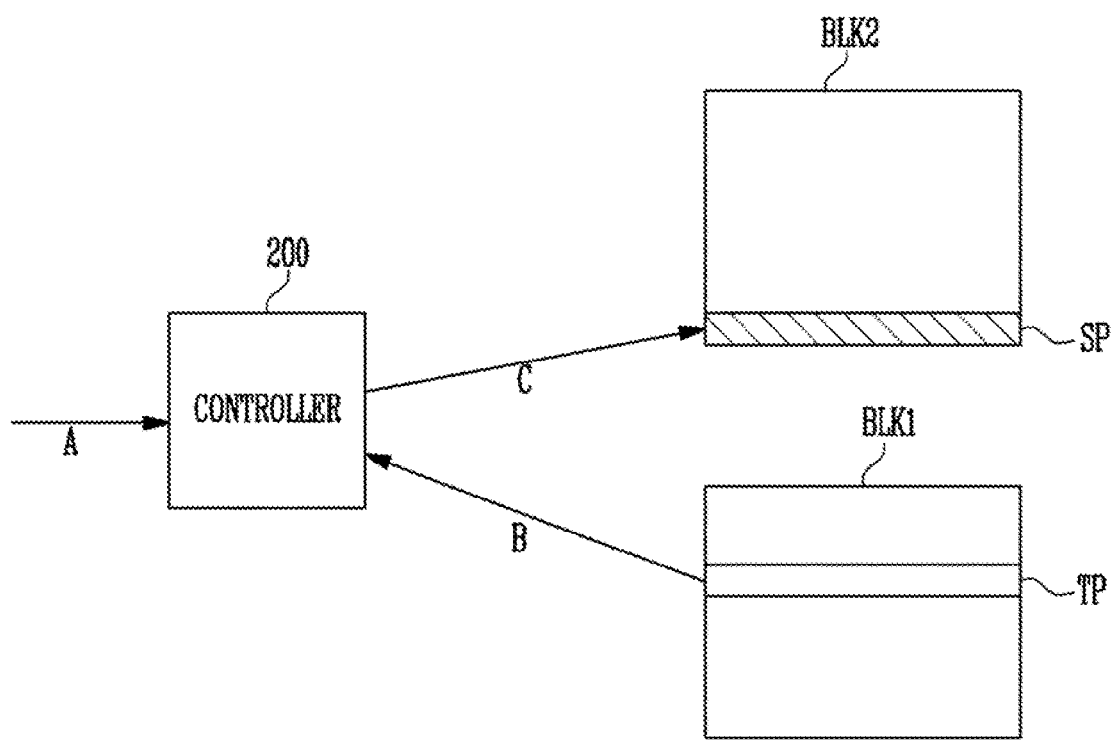
FIG. 9 is a view illustrating a process of performing a program on a substitution page, according to an embodiment of the present disclosure.

FIG. 9 illustrates a process of performing a program on a substitution page in lieu of a target page when a program request is received, according to an embodiment of the present disclosure. In the embodiment of FIG. 9, a target page TP may be included in the first memory block BLK1 while a substitution page SP may be included in the second memory block BLK2. For example, the process of FIG. 9 may be performed by the controller 200 of FIG. 1.

Referring to FIG. 9, the controller 200 may receive a program request ("A") from a host. If the first memory block BLK1 containing a target page TP is an open block, the controller 200 may read data ("B") from the target page TP using the test read voltage Vtst as shown in FIG. 4. If, however, among the data bits included in the read data, the number of data bits having the first logic value is greater than the preset value, the controller 200 may perform programming ("C") on the substitution page SP in lieu of the target page TP and data to be programmed may be stored in the substitution page SP.

Figure 10:
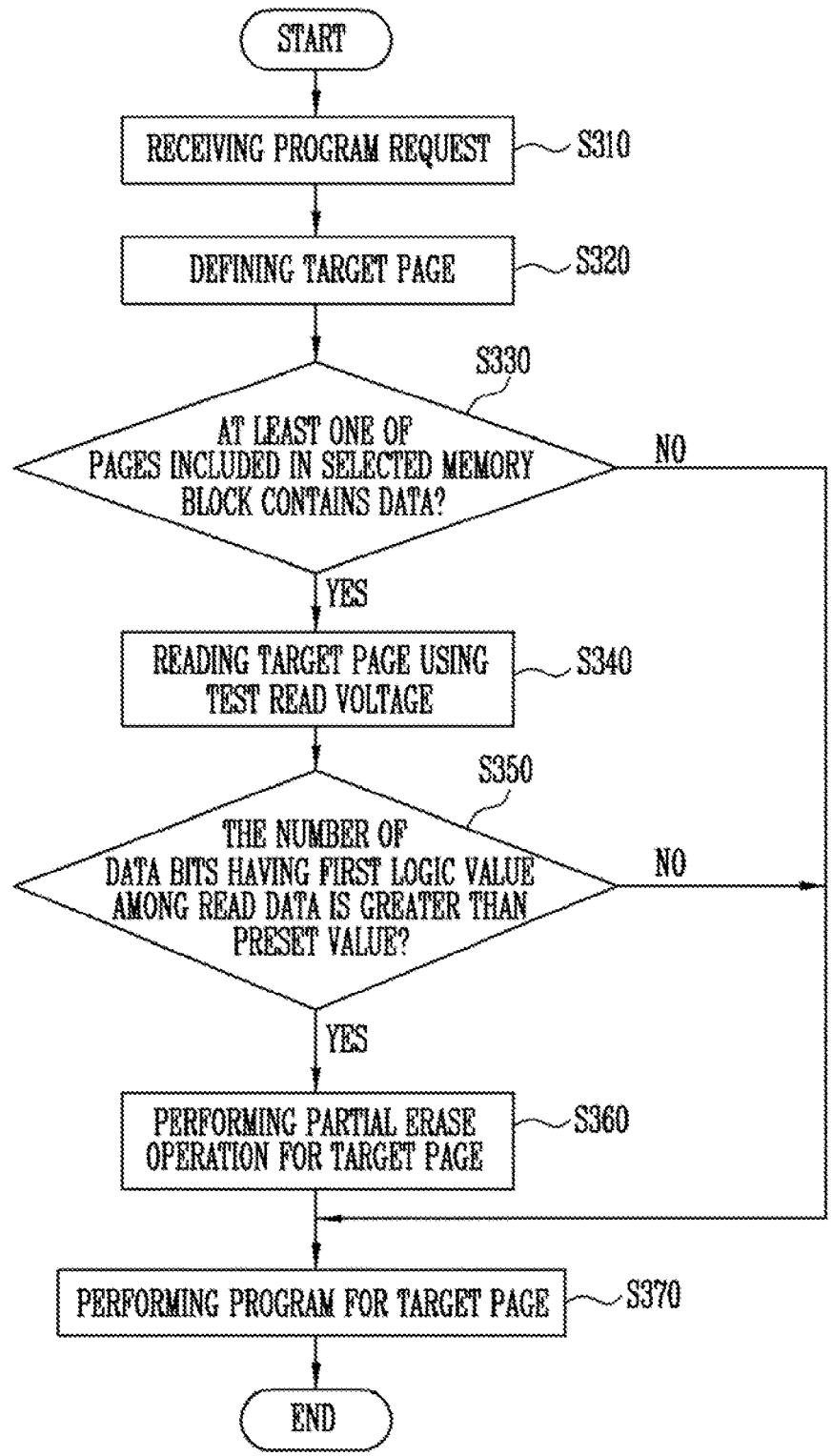
FIG. 10 is a flowchart illustrating a method for operating a memory system, according to another embodiment of the present disclosure.

FIG. 10 is a flowchart showing a method for operating a memory system, according to another embodiment of the present disclosure. For example, the operation of FIG. 10 may be performed by the memory system 50 in FIG. 1.

Referring to FIG. 10, steps S310 to S340 may be operated in the same manner as those of steps S110 to S140 of FIG. 5. Hereinafter, repetitive explanations will be omitted.

At step S350, it may be determined whether, among the read data, the number of data bits having the first logic value is greater than a preset value. If so, steps S360 and S370 may be performed. If not, step S370 may be performed.

At step S360, a partial erase operation for the target page may be performed. Hence, in accordance with an embodiment of the invention, when, among the read data, the number of data bits having the first logic value is greater than the preset value, the partial erase operation for the target page may be performed.

The memory control unit 200 of FIG. 1 may control the semiconductor memory device 100 for performing a partial erase operation for the target page. In an embodiment, the controller 200 may perform the partial erase operation for the target page. For example, in response to a corresponding partial erase command, the semiconductor memory device 100 may apply a high-level erase voltage to a substrate, that is, bodies of memory cells, of a selected memory block. The semiconductor memory device 100 may apply a ground voltage to a word line (e.g., WLn−1 of FIG. 3) coupled to the target page and float the other word lines (e.g., WL1 to WLn−2 and WLn of FIG. 3). The memory cells of the target page may have threshold voltages reduced by an electric field formed by the erase voltage and the ground voltage. In an embodiment, the controller 200 may perform a partial erase operation for a sub-block including the target page. For example, the semiconductor memory device 100 may apply a high-level erase voltage to the substrate of the selected memory block in response to the corresponding partial erase command. The semiconductor memory device 100 may apply the ground voltage to word lines (e.g., WLn−1 and WLn of FIG. 3) coupled to the sub-block to which the target page belongs, and may float the other word lines WL1 to WLn−2. The threshold voltages of the memory cells included in the sub-block may be reduced by an electric field formed by the erase voltage and the ground voltage.

As a result of the partial erase operation for the target page, the target page may have an erase state E as shown in FIG. 4.

As step S370, programming for the target page may be performed. The memory control unit 220 may provide a program command, a physical block address corresponding to the target page, and data to be programmed to the semiconductor memory device 100.

In accordance with an embodiment, the target page having the transformed erase state EE as shown in FIG. 4 may have an erase state E due to the partial erase operation. Thereafter, programming for the target page may be performed. Consequently, a memory system having enhanced reliability and the program method thereof may be provided.

Figure 11:
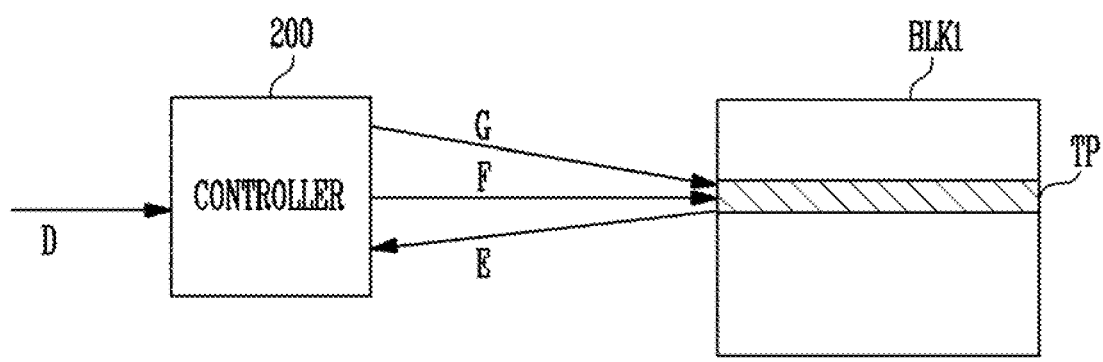
FIG. 11 is a view illustrating a process of performing a program on a target page, according to another embodiment of the present disclosure.

FIG. 11 illustrates a process of executing a program on a target page when a program request is received, according to another embodiment of the present disclosure. In FIG. 11, the case is illustrated in which the target page TP may be included in the first memory block BLK1. For example, the process of FIG. 9 may be performed by the controller 200 of FIG. 1.

Referring to FIG. 11, the controller 200 may receive a program request ("D") from a host. If the first memory block BLK1 is an open block, the controller 200 may read data ("E") from the target page TP using the teat read voltage Vtst. If, among the data bits included in the read data, the number of data bits having the first logic value is greater than the preset value, the controller 200 may perform a partial erase operation ("F") for the target page TP. After the partial erase operation for the target page TP, the controller 200 may perform programming ("G") for the target page TP. Data to be programmed may be stored in the target page TP.

If the data to be programmed are critical, programming of the substitution page SP may be performed. In this case, the target page TP may be considered as including memory cells having low reliability, and may be thus updated as an invalid page in the map table MPT. On the other hand, if the data to be programmed are not critical, the program for the target page TP may be performed after the partial erase operation for the target page TP.

Figure 12:
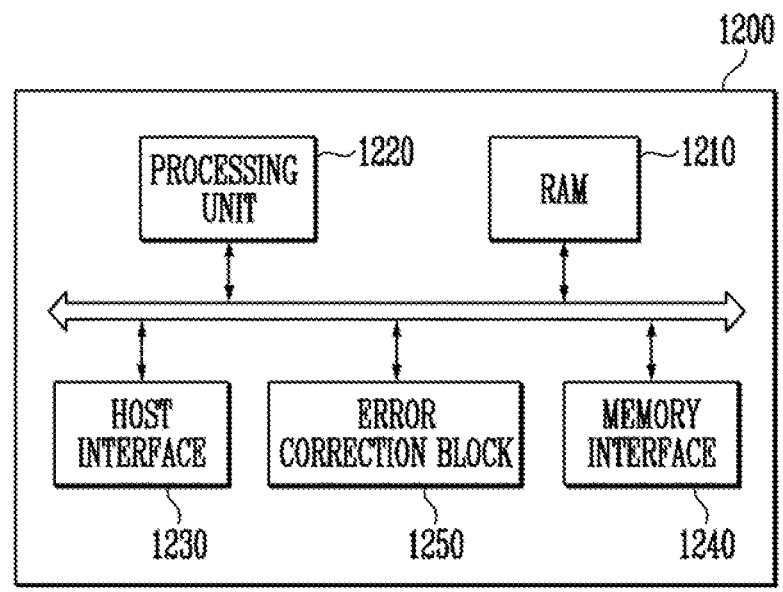
FIG. 12 is a block diagram illustrating a controller according to an embodiment of the present disclosure.

FIG. 12 is a block diagram showing a controller according to an embodiment of the present disclosure. For example, the controller of FIG. 12 may be the controller 200 of FIG. 1.

Referring to FIG. 12, the controller 1200 may include a random access memory (RAM) 1210, a processing unit 1220, a host interface 1230, a memory interface 1240, and an error correction block 1250.

The processing unit 1220 may control the overall operation of the controller 1200. The RAM 1210 may be used as at least one of an operation memory of the processing unit 1220, a cache memory between the semiconductor memory device (e.g., the semiconductor memory device 100 of FIG. 1) and the host, and a buffer memory between the semiconductor memory device 100 and the host. The processing unit 1220 and the RAM 1210 may perform the functions of the memory control unit 220 and the comparator 230 of FIG. 1.

For example, the processing unit 1220 may load a program command, a data file, a data structure, and the like into the RAM 1210 and execute the loaded data. In this way, the processing unit 1220 may perform the functions of the memory control unit 220 and the comparator 230.

In addition, the RAM 1210 may function as the RAM 210 of FIG. 1. Although in FIG. 12 the single RAM 1210 is illustrated as being used, two or more RAMs may be used.

The host interface 1230 may include a protocol for performing data exchange between the host and the controller 1200. In an exemplary embodiment, the controller 1200 may be configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1240 may interface with the semiconductor memory device 100. The error correction block 1250 may use an error correction code (ECC) to detect and correct errors in data read from the semiconductor memory device 100.

The controller 1200 and the semiconductor memory device 100 of FIG. 1 may be integrated into a single semiconductor device. In an embodiment, the controller 1200 and the semiconductor memory device 100 may be integrated into a single semiconductor device to form a memory card. For example, the controller 1200 and the semiconductor memory device 100 may be integrated into a single semiconductor device and form a memory card such as a personal computer memory card international association (PCMCIA) card, a compact flash (CF) card, a smart media card (SMC), a memory stick multimedia card (e.g., MMC, RS-MMC, or MMCmicro), an SD card (e.g., SD, miniSD, microSD, or SDHC), a universal flash storage (UFS), and the like.

The controller 1200 and the semiconductor memory device 100 may be integrated into a single semiconductor device to form a solid state drive (SSD). When the controller 1200 and the semiconductor memory device 100 are implemented as an SSD, the operation speed of the host may be substantially improved.

In yet another embodiment, the controller 1200 and the semiconductor memory device 100 may be provided as one of various elements of an electronic device such as a computer, a ultra-mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the controller 1200 and the semiconductor memory device 100 may be mounted in various types of packages. For example, the controller 1200 and the semiconductor memory device 100 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 13:
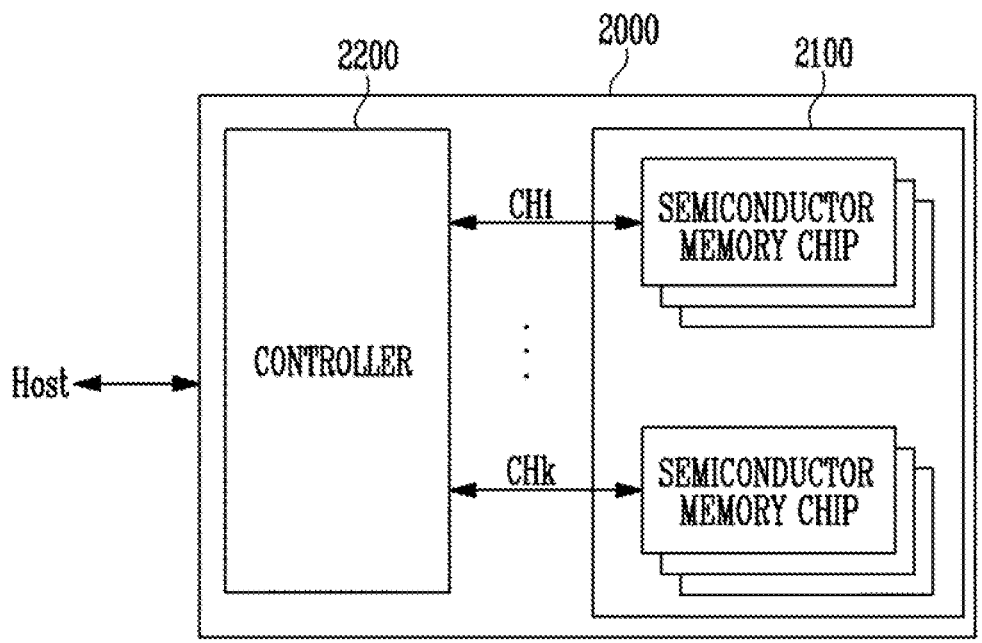
FIG. 13 is a block diagram illustrating an application of a memory system, according to an embodiment of the present disclosure.

FIG. 13 is a block diagram showing an application of a memory system, according to an embodiment of the present disclosure. For example, the memory system of FIG. 13 may be corresponding to the memory system 50 of FIG. 1.

Referring FIG. 13, the memory system 2000 may include a semiconductor memory device 2100 and a controller 2200. The semiconductor memory device 2100 may include a plurality of memory chips. The semiconductor memory chips may be divided into a plurality of groups.

In one example, the case is illustrated in which each of the plurality of groups may communicate with the controller 2200 through first to k-th channels CH1 to CHk. Each semiconductor memory chip may be configured and operated in the same manner as the semiconductor memory device 100 described with reference to FIG. 1.

Each group may communicate with the controller 2200 through one common channel. The controller 2200 may have the same configuration as the controller 1200 described with reference to FIG. 1, and may be configured to control a plurality of memory chips of the semiconductor memory device 2100 through the plurality of channels CH1 to CHk.

In FIG. 13, a plurality of semiconductor memory chips is illustrated as being coupled to each channel. However, it will be understood that the memory system 2000 may be modified so that a single memory chip is coupled to each channel.

Figure 14:
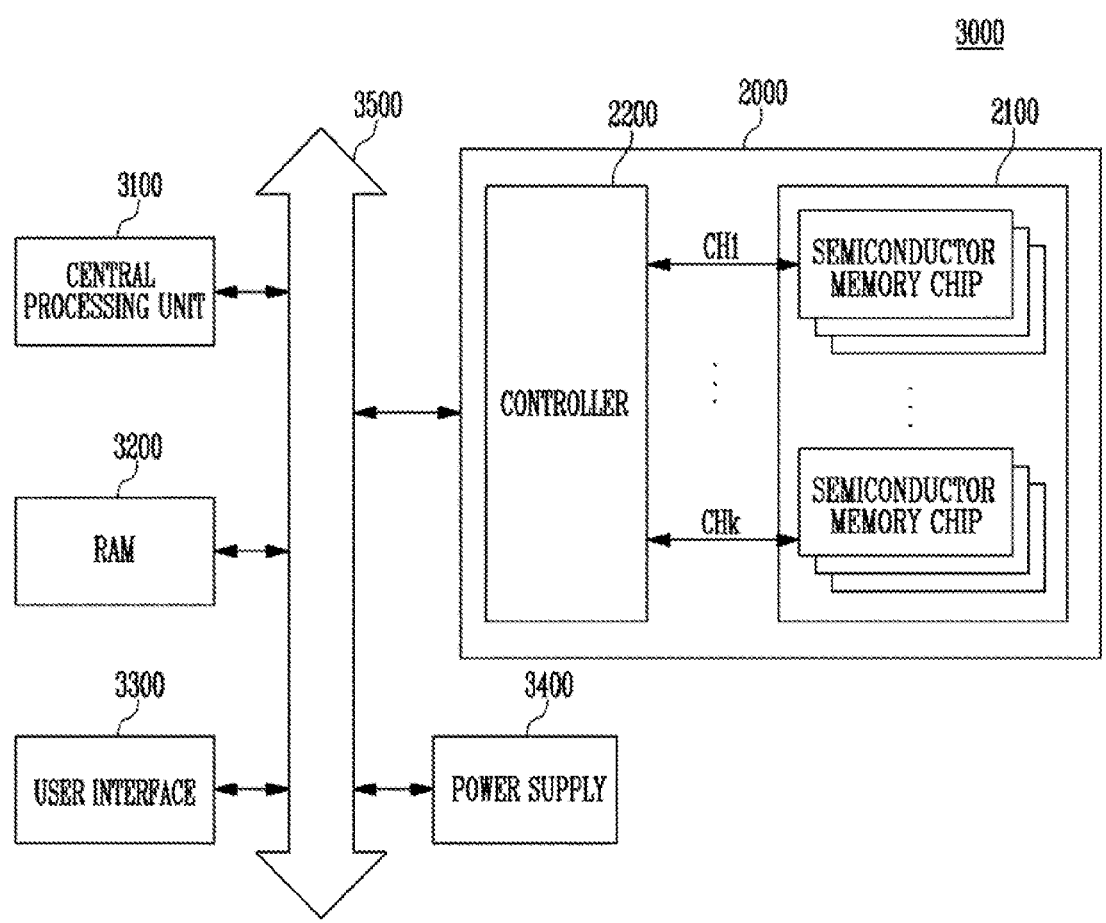
FIG. 14 is a block diagram illustrating a computing system including a memory system, according to an embodiment of the present disclosure.

FIG. 14 is a block diagram illustrating a computing system 3000 including a memory system, according to an embodiment of the present disclosure. For example, a computing system 3000 may include the memory system 2000 in FIG. 13.

Referring to FIG. 14, the computing system 3000 may include a central processing unit (CPU) 3100, a random access memory (RAM) 3200, a user interface 3300, a power supply 3400, a system bus 3500, and a memory system 2000.

The memory system 2000 may be electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 14, the semiconductor memory device 2100 is illustrated as being coupled to the system bus 3500 through the controller 2200. However, it is noted that the semiconductor memory device 2100 may be directly coupled to the system bus 3500. The function of the controller 2200 may be performed by the CPU 3100 and the RAM 3200.

In the embodiment of FIG. 14, the memory system 2000 may be employed as illustrated. However, it is noted, that the memory system 2000 may be replaced with the memory system 50 described with reference to FIG. 1.

According to an embodiment of the present disclosure, when the memory block including the target page is an open block, the controller 200 may perform an operation of reading the target page using the test read voltage before a program operation. Based on the read data, it may be determined whether the threshold voltages of the memory cells in the target page have been undesirably increased. Depending on the result of the determination, programming for the target page may be performed. Consequently, a memory system having enhanced reliability and a program method thereof are provided.

While the exemplary embodiments of the present disclosure have been disclosed for illustrative purposes, those skilled in the art will appreciate that various modifications, additions and substitutions are possible. Therefore, it should be noted that the scope of the present invention is not intended to be limited by the described embodiments. Many other embodiments and variations of the invention may be envisaged by those skilled in the art, after having read the present disclosure, without departing from the scope and spirit of the present invention as defined by the appended claims.

What is claimed is:

1. A method of programming a memory system including a semiconductor memory device with a plurality of memory blocks, each memory block comprising a plurality of pages, the method comprising:
  reading a target page included in a selected memory block in response to a program request when at least one of the plurality of the pages included in the selected memory block contains data; and
  performing a program for the target page when, among data bits included in the data read from the target page, a number of data bits having a first logic value is equal to or less than a preset value.

2. The method according to claim 1, further comprising:
  performing the program on a page of a memory block other than the selected memory block when, among data bits included in the read data, the number of data bits having the first logic value is greater than the preset value.

3. The method according to claim 1, further comprising:
  performing a partial erase operation for the target page when, among data bits included in the read data, the number of data bits having the first logic value is greater than the preset value; and
  performing a program for the target page after the partial erase operation.

4. The method according to claim 1, further comprising:
  performing the program for the target page when the pages included in the selected memory block do not contain data.

5. The method according to claim 1,
  wherein the pages included in the selected memory block have an erase state and a plurality of program states when storing data, and
  wherein the test read voltage falls within a read margin between a voltage range of the erase state and a voltage range of a lowest program state among the plurality of program states.

6. The method according to claim 1, wherein the reading the target page comprises reading the target page included in the selected memory block in response to the program request using a test read voltage.

7. The method according to claim 6, wherein the reading the target page using the test read voltage comprises:
  controlling the semiconductor memory device to generate the test read voltage during a read operation; and
  controlling the semiconductor memory device to perform the read operation for the target page.

8. The method according to claim 1, further comprising:
receiving the program request; and
defining the target page included in the selected memory block in response to the program request.

9. The method according to claim 8, wherein the defining the target page comprises:
converting a logic block address included in the program request into a physical block address corresponding to the target page with reference to mapping information between logic block addresses and physical block addresses.

10. A memory system comprising:
a semiconductor memory device comprising a plurality of memory blocks, each of which includes a plurality of pages; and
a controller configured so that the controller reads a target page depending on whether at least one of pages of a memory block including the target page contains data,
wherein the controller performs a program for the target page when, among data bits included in the data read from the target page, a number of data bits having a first logic value is equal to or less than a preset value.

11. The memory system according to claim 10, wherein the controller performs the program for the target page when the pages of the memory block including the target page do not contain data.

12. The memory system according to claim 10,
wherein the plurality of pages have an erase state and a plurality of program states when storing data, and
wherein the test read voltage falls within a read margin between a voltage range of the erase state and a voltage range of a lowest program state among the plurality of program states.

13. The memory system according to claim 10, wherein when, among data bits included in the read data, the number of data bits having the first logic value is greater than the preset value, the controller performs the program on a page of a memory block other than the memory block including the target page.

14. The memory system according to claim 10, wherein when, among data bits included in the read data, the number of data bits having the first logic value is greater than the preset value, the controller performs a partial erase operation for the target page and then performs the program for the target page.

15. A memory system comprising:
a semiconductor memory device comprising a plurality of memory blocks, each memory block comprising a plurality of pages; and
a controller suitable for reading a target page depending on whether, among pages of a first memory block including the target page, a number of pages that contain data is equal or greater than a predetermined number,
wherein the controller performs a program for the target page when, among data bits included in the data read from the target page, a number of data bits having a first logic value is equal to or less than a preset value.

16. The memory system according to claim 15, wherein when, among the pages of the first memory block, the number of pages that contain data is less than the predetermined number, the controller performs the program for the target page.

17. The memory system according to claim 15,
wherein the plurality of pages have an erase state and a plurality of program states when storing data, and
wherein the test read voltage falls within a read margin between a voltage range of the erase state and a voltage range of a lowest program state among the plurality of program states.

18. The memory system according to claim 15, wherein the controller performs the program on a page of a second memory block, when, among data bits included in the read data, the number of data bits having the first logic value is greater than the preset value.

19. The memory system according to claim 15, wherein when, among data bits included in the read data, the number of data bits having the first logic value is greater than the preset value, the controller performs a partial erase operation for the target page and then performs the program for the target page.

20. The memory system according to claim 15, wherein the controller reads the target page using a test read voltage by controlling the semiconductor memory device to generate the test read voltage during a read operation and controlling the semiconductor memory device to perform the read operation for the target page.

* * * * *